May 17, 1966 P. F. SCHMIDT 3,252,003

UNIPOLAR TRANSISTOR

Filed Sept. 10, 1962 2 Sheets-Sheet 1

WITNESSES:

Bernard R. Gieguez

Leon M. Garman

INVENTOR

Paul F. Schmidt

BY Gordon H. Telfer

ATTORNEY 3,252,003

UNIPOLAR TRANSISTOR

Paul F. Schmidt, Pittsburgh, Pa., assignor to Westinghouse Electric Corporation, Pittsburgh, Pa., a corporation of Pennsylvania Filed Sept. 10, 1962, Ser. No. 222,568
3 Claims. (Cl. 307—88.5)

This invention relates generally to semiconductor devices and, more particularly, to those known as unipolar or field effect transistors.

A unipolar transistor is a device in which a working current of majority carriers enters semiconductive material from a first electrode called the source and leaves the semiconductor through a second electrode called the drain. A rectifying contact, called the gate, on the semiconductive region through which the current passes controls the magnitude of the current between the source and drain by reason of the creation of a depletion layer at the rectifying junction upon application of a reverse bias thereto. The current carrying material is called the channel and it will be of largest size when no reverse bias is placed across the gate junction and will diminish to essentially nothing when a sufficient reverse voltage, called the pinch off voltage, is applied.

One of the features which it is desirable to obtain in a unipolar transistor is that of short, controlled distances between the source and the drain so as to limit the series resistance of the device and reduce thermal dissipation. At the same time, it is desirable to provide a heat sink at or near the drain contact since it is in this region that thermal dissipation is greatest. The limitations imposed by heat problems in prior art devices limit such devices to relatively small current signal levels. It is also desirable to permit low pinch off voltages and high transconductances in unipolar transistors. The transconductance is defined as the change in applied gate bias necessary for a unit change in drain current.

It is, therefore, an object of this invention to provide improved unipolar transistors.

Another object is to provide unipolar transistors capable of handling relatively large currents without excessive heating.

Another object is to provide unipolar transistors with a geometrical configuration permitting low pinch off voltages and high transconductances.

Another object of the invention is to provide improved methods for the fabrication of unipolar transistors which permit improved characteristics and greater flexibility in design.

The invention will now be described generally, without defining its exact limits. The foregoing and other objects are achieved by providing a unipolar transistor usually comprising first, second and third semiconductive regions of which the second is of opposite semiconductivity type to that of the first and third regions. The second region is disposed within the first region to provide a pattern with surface portions of the first region surrounded by the second region. Ohmic contact means are provided on the exposed surfaces of the first and third regions. A third ohmic contact means is provided to the second region. The first and second ohmic contact means are utilized as source and drain contacts. It is not critical which of the first and second ohmic contact means is the source and which is the drain. The second region to which the third ohmic contact means is affixed is operated as a gate region and upon the application of a reverse bias potential thereto control of current flow between the source and the drain contacts is provided. It is to be noted that the gate region is "buried" within the semiconductive material which provides the channel. The working current passes through the openings in the gate region, which openings may be made as small as permissible by existing fabrication techniques.

It is particularly advantageous to diffuse the second region into a surface of the first region and thereby provide precise definition of the second region. The third region may then be provided by an epitaxial layer disposed on the planar surface of the first and second regions. Thus, the method of fabrication in accordance with this invention requires only one diffusion operation into one surface of the first region or substrate and only one epitaxial growth operation upon that same surface.

Because both the source and drain may be large area contacts, adequate heat dissipation may be provided by affixing suitable heat sinks, particularly to the drain contact. It is also the case that precise control of channel length is possible so as to limit heat dissipation. In addition, the fact that the second region which serves as the gate may be a thin layer permits very high transconductances.

The present invention, both as to its structure, fabrication and manner of operation, together with the abovementioned and further objects and advantages thereof, may best be understood by reference to the following description, taken in connection with the accompanying drawings, in which.

Figure 1:
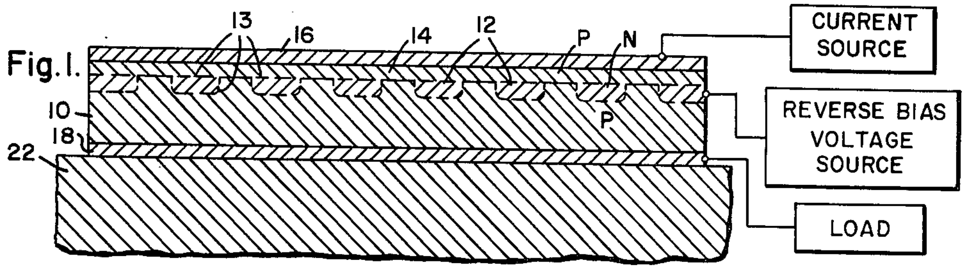
FIGURE 1 is a cross-sectional view of a unipolar transistor in accordance with this invention together with a schematic showing of electrical connections.
Figure 2:
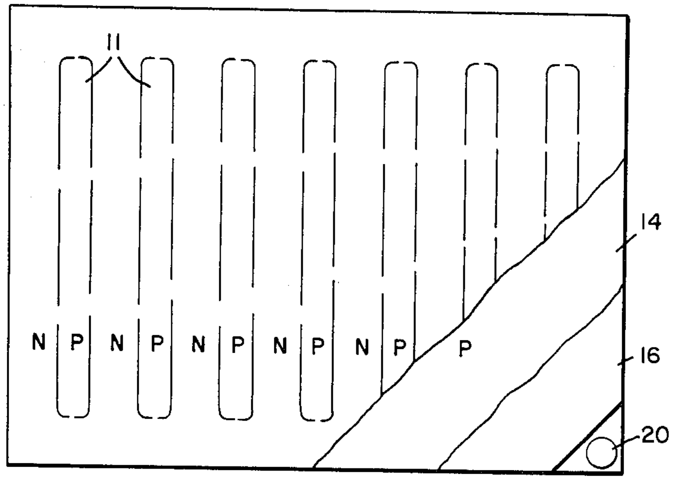
FIG. 2 is a plan view of the device of FIG. 1 with the structure partially broken away so as to better illustrate the configuration of the gate region in accordance with this invention.

Referring to FIGS. 1 and 2, there is shown a device comprising a substrate 10 or first semiconductive region of a first type of semiconductivity, here shown as p-type for an example. The first region has opposing major surfaces of relatively large area. On portions of one major surface there is disposed a second semiconductive region 12 of opposite semiconductivity type so that surface portions 11 of the first region having the same size and shape are surrounded by portions of the second region 12. A third semiconductive region 14 of the same type of semiconductivity as the first region 10 is disposed on the second region 12 and the exposed portions 11 of the first region 10. A p-n junction 13 is formed between the second region 12 and the first and third regions 10 and 14. Ohmic contacts 16 and 18 are disposed on the exposed surface of the third region 14 and the lower surface of the first region 10, respectively. A third ohmic contact 20 is affixed to an exposed peripheral portion of the second region 12. It will be recognized that the various regions as illustrated in the drawing are not shown to scale.

The substrate 10 or first semiconductive region is generally the starting material of the device. The thickness of this region is preferably quite small but must be sufficient so as to give the structure mechanical strength necessary in fabrication and use. The electrical characteristics of the substrate may be selected over a relatively wide range but it may, for example, be of silicon uniformly doped with boron to provide a resistivity which is preferably of from about 1 ohm-cm. to about 200 ohm-cm.

Figure 3:
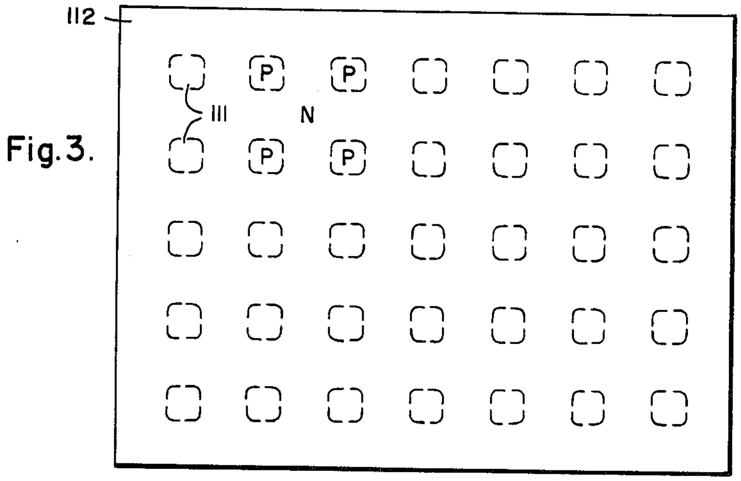
FIG. 3 is a plan view of part of an alternative embodiment of a device in accordance with this invention illustrating another configuration of the buried gate.

The second semiconductive region 12 is shaped so as to permit current flow between the third region 14 and the first region 10 without penetration of a rectifying junction. The material of the first and third regions provides the channel of the unipolar transistor and it is by reason of application of a reverse bias voltage to the second region that gate control is achieved. The particular configuration of the gate region may comprise a plurality of interconnected strips leaving elongated strip-like openings as shown in FIG. 2 which leave exposed the portions 11 of the first region 10. Alternatively, as in FIG. 3, the gate region 112 may comprise a network of intersecting strips leaving square openings through which the portions 111 of the underlying first region extend. The dimensions of the openings of the gate region 12 may be varied within relatively wide limits but are preferably quite small so as to permit low pinch off voltages. Typically the width of the strips of the gate region 12 and the gaps between the strips may be from about 0.5 mil to about 1 mil. The thickness of the gate region 12 is also preferably quite small so as to permit high transconductances. By way of example, the second region 12 may have a thickness of from about 0.2 mil to about 1 mil and as formed by diffusion techniques may have a surface concentration of from about $10^{18}$ atoms per cubic centimeters to about $10^{21}$ atoms per cubic centimeter.

The third semiconductive region 14 is joined with the first and second regions 10 and 12 in a monocrystalline structure and is preferably a very thin epitaxial layer having a resistivity of from about 1 ohm-cm. to about 200 ohm-cm. and a thickness of from about 0.2 mil to about 1 mil.

The first and second ohmic contacts 16 and 18 are preferably formed over the entire upper and lower surfaces of the device structure and may be, for example, either alloyed foils or a layer of aluminum evaporated thereon and then alloyed. The ohmic contacts 16 and 18 may, since the structure is essentially symmetrical, be utilized as either source or drain. As shown in FIG. 1 the connections are for the first ohmic contact means 16 to be utilized as the source contact and the second ohmic contact means 18 to be utilized as the drain contact. However, it is to be expressly understood that the ohmic contacts 16 and 18 may be utilized in the opposite manner. In either case the current path is short since it is normal to the plane of the semiconductive wafer.

The third ohmic contact means 20 is affixed to a peripheral portion of the second region 12 for application of the reverse bias voltage to the gate region 12. The exposed peripheral portion of the gate 12 to which contact is made may be formed by cutting or etching away a portion of the third semiconductive region 14.

The device is conveniently mounted with the drain contact 18 affixed to a heat sink 22 any suitable configuration to provide adequate means for dissipating heat generated in the device.

Merely as an example, the invention is described in a semiconductive body of silicon. In addition to silicon, however, other semiconductive materials such as germanium or a semiconductive compound are suitable. For example, a compound of stoichiometric portions of elements from Group III of the Periodic Table such as gallium, aluminum and indium, and elements from Group V of the Periodic Table, such as arsenic, phosphorous and antimony, may be used. Examples of suitable Group III–V stoichiometric compounds include gallium arsenide, gallium antimonide, gallium phosphide and indium arsenide. A compound of two elements of Group IV of the Periodic Table such as silicon carbide or a compound of an element of Group II of the Periodic Table and an element of Group VI of the Periodic Table such as cadmium sulfide are further examples of suitable materials.

In describing the invention, devices are shown in which a particular type of semiconductivity is ascribed to each semiconductive region. However, the semiconductivity of the various regions may be reversed from that shown. Also, the inclusion of additional structural features within the same block of material is satisfactory if the essential topological characteristics of the described regions are retained. For example, devices suitable for use in the practice of this invention may be incorporated in more complex monolithic devices where there is a sufficient degree of electrical isolation provided from other device portions.

Among the modifications which may be utilized in the practice of this invention and which may be readily practiced by those skilled in the art are the following. The substrate or first semiconductive region 10 may include an additional epitaxial layer on the surface of the starting material prior to formation of the gate region 12. This will provide low series resistance and high carrier lifetime. Also, a shallow diffusion of the same conductivity type as the substrate may be performed on the upper and lower surfaces prior to the formation of ohmic contacts 16 and 18 to lower contact resistance. Also, an opposite impurity type region may be formed for providing an injecting drain. These modifications, among others, may be used singly or in combination.

There will now be described by way of example a typical device in accordance with this invention as shown in FIGS. 1 and 2. A starting wafer or die may be prepared by any of the known methods. For example, a suitable substrate 10 is a cut and lapped wafer from a drawn single crystal silicon rod or a section of a dendritic crystal prepared in accordance with U.S. Patent 3,031,403 issued April 24, 1962, the assignee of which is the same as that of the present invention.

A suitable starting wafer has a resistivity of about 20 ohm-centimeters with a wafer cross-sectional dimension of about one-half inch and a thickness of about 4 mils. The surface of the wafer is prepared by treatment which includes polishing with particles of abrasive aluminum oxide having a particle diameter of about 0.3 micron. An oxide layer is formed on the wafer surface to a thickness of approximately 1 micron. The oxide layer may be formed by thermal oxidation of the wafer in water vapor with a silicon temperature of about 1150° C., a water bath temperature of about 90° C. and argon as a carrier gas flowing at 1 liter per minute. The oxide layer is selectively etched away on the upper surface using photoresist masking techniques and hydrogen fluoride etchant in a conventional manner. The oxide is thereby removed from those portions of the upper surface into which it is desired to diffuse an impurity to form the second semiconductive region 12. The portions 11 of the first region 10 remain covered by the oxide layer. Phosphorus is then diffused into the exposed portions with the substrate at a temperature of about 1075° C. for about one-half hour with $P_2O_5$ as the source at about 310° C. and dry oxygen as carrier gas flowing at 1 liter per minute. The resulting diffused region has a thickness of about one-half mil and a surface impurity concentration of about $10^{20}$ atoms per cubic centimeters.

The remaining oxide layer is then etched away with a suitable etchant such as that containing hydrofluoric acid and an epitaxially grown layer is produced of p-type silicon having a resistivity of about 20 ohm-cm. and a thickness of about 0.5 mil. To form the epitaxial layer, the silicon is placed in the reaction zone of a growth furnace and subjected to a surface treatment of pure hydrogen gas at about 1230° C. for thirty minutes. The atmosphere is then changed to a mixture of hydrogen and silicon tetrachloride doped with boron trichloride, the latter at partial pressure of 13 millimeters. This gas mixture is formed by passing the hydrogen over the mouth of a container in which the doped silicon tetrachloride is maintained at about −20° C. The growth is allowed to proceed for about twenty minutes with the silicon substrate at about 1230° C. In some instances it may be desirable for ease in fabrication to form the epitaxial layer 14 of n-type material. This may be done of course if the conductivity type of the regions 10 and 12 are reversed. Then by providing a suitable mask of apiezon wax or the like a corner of the epitaxial layer 14 is removed by etching to expose a peripheral portion of the gate region. The exposed portion of the junction 13 is protected by conventional techniques. The ohmic contacts 16, 18 and 20 are then formed by the evaporation of aluminum and alloying and leads are affixed by suitable methods and the device is mounted on the heat sink 22 and encapsulated.

The foregoing discussion has been primarily directed to the preferred embodiment of the invention wherein the second region or gate 12 is diffused into the substrate 10 and the third region 14 is grown epitaxially over the gate 12 and the exposed portions 11 of the substrate 10. However, other techniques may be employed to provide the desired geometrical features which include a gate which is thin and in close proximity to all parts of the current carrying channel between the source and drain contacts.

Figure 4A:
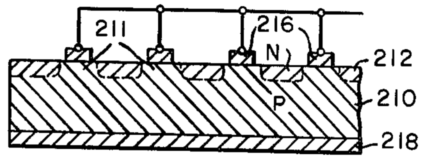
FIG. 4A through FIG. 4E are cross-sectional views of alternative embodiments of the invention.

FIG. 4A shows a device including a substrate 210 and a diffused gate 212 of opposite conductivity type. The gate 212 may also be made by alloying, for example by electron beam, in this embodiment. Instead of including a third region over the gate 212, ohmic contact 216 is made to the exposed portions 211 of the substrate 210. Such a device will operate satisfactorily but is not preferred due to lack of ease in forming the small sized ohmic contacts 216. The lower ohmic contact 218 may, of course, be continuous. The contacts 216 may be formed by techniques such as pulse-plating or electron beam alloying.

Figure 4B:
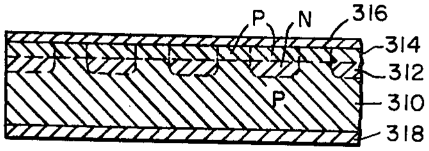

In FIG. 4B, the gate 312 is also diffused into the substrate 310 but a third region 314 is provided over the upper surface by large area diffusion. The third region 314 should be doped to a higher concentration than the gate 312 so that the upper surface is entirely of one semiconductivity type material. Continuous ohmic contacts 316 and 318 are provided on both surfaces.

Figure 4C:
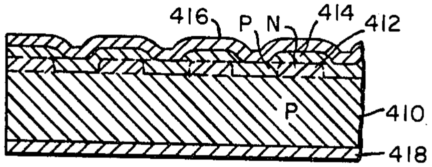

In FIG. 4C, the gate 412 is formed by epitaxial growth onto the substrate 410. This may be done through a suitable mask to provide the desired gate pattern. The third region 414 is also formed by epitaxial growth over the entire upper surface thus permitting a continuous ohmic contact 416.

Figure 4D:
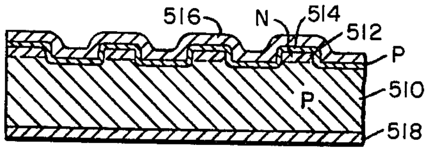

In FIG. 4D, the gate 512 is formed by epitaxial growth onto the substrate 510 and third region 514 is diffused into the entire upper surface. Here, too, continuous ohmic contacts 516 and 518 can be provided on the opposing surfaces of the device.

Figure 4E:
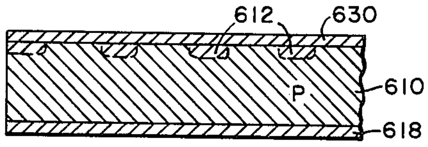

FIG. 4E illustrates another embodiment of the invention which does not employ an epitaxial layer on the upper surface of the device, such as layer 14 in FIGS. 1 and 2, but which does permit a continuous electrical contact on the upper surface. A continuous contact is generally more readily fabricated than one which must be disposed within the openings of the gate region, as the contacts 216 are in FIG. 4A. In FIG. 4E, the substrate 610 and the lower ohmic contact 618 may be as described in the previous embodiments. The gate region 612 may be diffused and then etched in order that the remaining material has a resistivity of at least about 1 ohm-centimeter. On the upper surface of the device is a contact 630 extending over the gate region 612 and the exposed portions of the substrate 610. The contact 630 utilizes the work function dependence of the rectification behavior of large area metal contacts on semiconductors such as silicon in order to provide a rectifying barrier between the contact 630 and the gate 612 and a ohmic contact to the substrate 610.

To form the device of FIG. 4E, after diffusing or alloying the gate region 612, the surface of the semiconductor is given a clean up etch to produce a defect-free surface and to ensure there are no regions of very low resistivity left at the surface which would limit the amount of reverse voltage which could be applied to the gate region 612. Following the etch, a metal film, serving as the contact 630, is deposited, for example, by evaporation or plating, over the entire semiconductive surface. The metal film 630 is not alloyed into the semiconductive surface after deposition because to do so would short out the gate junction. The material comprising the contact 630 is selected by its work function, that is, the amount of energy necessary to be imparted to an electron to remove it from the material into vacuum. For a p-type substrate, a high work function metal, such as those having a work function greater than about 4.7 ev. which include gold, platinum and palladium, may be employed. If semiconductivity types of the regions is reversed and an n-type substrate is employed, one would use a low work function metal, below about 4.2 ev., such as gallium, aluminum and zinc.

In the various embodiments of the present invention, the substrate 10, 110, 210, etc, need not be a region of uniform resistivity but may have selective portions of differning resistivity for improved operation. For example, a major portion of the substrate may be relatively low resistivity, such as about 5 ohm centimeters, and change to higher resistivity, such as 10 or 20 ohm centimeters, at about the depth to which the gate region 12, . . . 612 penetrates therein so that low pinch-off voltages may be achieved and the possibility of surface breakdown is minimized. At the extreme upper surface of the substrate there could be a very thin portion of higher resistivity so as not to introduce too high a contact resistance.

While the present invention has been shown and described in certain forms only, it will be obvious to those skilled in the art that it is not so limited but is susceptible of various changes and modifications without departing from the spirit and scope thereof.

I claim as my invention:

1. A unipolar transistor comprising: a first region of semiconductive material of a first type of conductivity, said first region comprising a first portion having a resistivity of from about 1 ohm centimeter to about 200 ohm centimeters; a second region of semiconductive material of a second type of conductivity in said first portion, said second region having a configuration of a plurality of interconnected strips having a width of about 0.5 mil to about 1 mil and having a spacing between strips of about 0.5 mil to about 1 mil, said second region having a surface impurity doping concentration of from about $10^{18}$ atoms per cubic centimeter to about $10^{21}$ atoms per cubic centimeter and a thickness of from about 0.2 mil to about 1 mil; said first region also comprising a second portion of semiconductive material of said first type of conductivity extending over said second region except for a portion exposed at a periphery thereof, said second portion having a resistivity of from about 1 ohm-centimeter to about 200 ohm-centimeters and a thickness of from about 0.2 mil to about 1 mil. first and second ohmic contact means disposed on said first and second portions and providing source and drain contacts; third ohmic contact means disposed on said exposed portion of said second region and providing a gate contact for the application of a potential thereto to control current flow between said source and drain contacts; and heat dissipation means secured to at least one of said first and second ohmic contacts.

2. A unipolar transistor in accordance with claim 1 further comprising: means to apply an input current to one of said first and second ohmic contact means; means to derive an output current from the other of said first and second ohmic contact means; and means associated with said gate contact to apply a reverse bias across the PN junction between said second region and said first and second portions of said first region to modulate the current between said first and second ohmic contact means.

3. A unipolar transistor in accordance with claim 1 wherein: said first and second regions are of impurity doped silicon; and said first and second ohmic contact means comprise, respectively, a layer of conductive material bonded to an exposed surface of each of said first and second portions.

(References on following page)

References Cited by the Examiner

UNITED STATES PATENTS

| | | | |
|---|---|---|---|
| 2,631,356 | 3/1953 | Sparks et al. | 29—25.3 |
| 2,666,814 | 1/1954 | Shockley | 317—235 X |
| 2,790,037 | 4/1957 | Shockley | 317—235 X |
| 2,926,418 | 3/1960 | Zuleeg | 29—25.3 |
| 2,930,950 | 3/1960 | Teszner | 317—235 |
| 2,971,140 | 2/1961 | Chappey et al. | 317—235 |

| | | | |
|---|---|---|---|
| 3,001,111 | 9/1961 | Chappey | 317—235 |
| 3,024,438 | 3/1962 | Wegener | 317—235 |
| 3,114,867 | 12/1963 | Szekely | 317—235 |

JOHN W. HUCKERT, *Primary Examiner.*

JAMES D. KALLAM, *Examiner.*

R. F. POLISSACK, *Assistant Examiner.*